United States Patent
Stange et al.

(10) Patent No.: US 11,274,812 B2
(45) Date of Patent: Mar. 15, 2022

(54) LED ARRANGEMENT AND LIGHTING DEVICE

(71) Applicant: OSRAM GmbH, Munich (DE)

(72) Inventors: Markus Stange, Berlin (DE); Ulrich Hartwig, Berlin (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 17/259,999

(22) PCT Filed: Jul. 9, 2019

(86) PCT No.: PCT/EP2019/068438
§ 371 (c)(1),
(2) Date: Jan. 13, 2021

(87) PCT Pub. No.: WO2020/011798
PCT Pub. Date: Jan. 16, 2020

(65) Prior Publication Data
US 2021/0348742 A1    Nov. 11, 2021

(30) Foreign Application Priority Data

Jul. 13, 2018    (DE) ..................... 10 2018 211 723.3

(51) Int. Cl.
*H01J 9/02*    (2006.01)
*F21V 19/00*    (2006.01)
(Continued)

(52) U.S. Cl.
CPC ...... *F21V 19/0025* (2013.01); *H01L 25/0753* (2013.01); *H01L 33/62* (2013.01); *F21Y 2115/10* (2016.08)

(58) Field of Classification Search
CPC .......... H05K 2201/10106; F21V 29/70; F21V 23/06
See application file for complete search history.

(56) References Cited

U.S. PATENT DOCUMENTS

2008/0099772 A1* 5/2008 Shuy ..................... H01L 27/156
257/88
2008/0170396 A1* 7/2008 Yuan ......................... F21V 5/10
362/244
(Continued)

FOREIGN PATENT DOCUMENTS

EP       1 249 874 A2    10/2002
WO    2012/040084 A1    3/2012
(Continued)

*Primary Examiner* — Andrew J Coughlin
(74) *Attorney, Agent, or Firm* — DLA Piper LLP (US)

(57) ABSTRACT

An LED arrangement includes two current connection regions arranged on a substrate, a plurality of LED groups including LEDs, each having first and second LED contact regions. The LED arrangement includes a plurality of electrically conductive coating regions spatially separated from one another on the substrate and each subdivided into contact and transition regions, wherein the second current connection region constitutes one of the transition regions, each LED group is arranged on exactly one assigned coating region, one of the current connection regions electrically conductively connects to a second LED contact region of one of the LEDs arranged at the edge region, and, apart from the other current connection region, a relevant transition region electrically conductively connects to a second LED contact region of one of the LEDs of an adjacent LED group arranged at the edge region such that the plurality of LED groups are connected in series.

24 Claims, 12 Drawing Sheets

(51) Int. Cl.
_H01L 33/62_ (2010.01)
_H01L 25/075_ (2006.01)
_F21Y 115/10_ (2016.01)

(56) References Cited

U.S. PATENT DOCUMENTS

| | | | |
|---|---|---|---|
| 2008/0224608 A1* | 9/2008 | Konishi | H01L 33/641 |
| | | | 313/505 |
| 2011/0090691 A1 | 4/2011 | Markle et al. | |
| 2011/0316009 A1 | 12/2011 | Fukasawa | |
| 2019/0123251 A1 | 4/2019 | Neudecker et al. | |

FOREIGN PATENT DOCUMENTS

| | | |
|---|---|---|
| WO | 2014/207620 A1 | 12/2014 |
| WO | 2017/174776 A1 | 10/2017 |

* cited by examiner

LED ARRANGEMENT AND LIGHTING DEVICE

TECHNICAL FIELD

This disclosure relates to an LED arrangement having a substrate, an electrically conductive first current connection region arranged on the substrate, an electrically conductive second current connection region arranged on the substrate, and a plurality of LEDs which form a plurality of LED groups, each LED of which has a first LED contact region and a second LED contact region. In particular, the two respective LED contact regions of an LED are used to provide a current supply to the respective LED. The disclosure also includes a lighting device having an LED arrangement.

BACKGROUND

There are many applications that require a light source that is as point-like as possible and has the highest possible luminance. Provision of such a light source by an appropriate LED arrangement requires, on the one hand, a large number of LEDs to provide the high luminance and, on the other hand, the LEDs must be able to be arranged as compactly as possible. Therefore, it is desirable to arrange as many LEDs as possible in the most compact way possible. However, the following difficulties arise: on the one hand, arrangements are known from the prior art in which multiple LEDs are arranged at a common potential, known as a common ground, which can be provided, for example, by a large-area metallic coating, as this reduces the spacing between the LEDs to a minimum while allowing the LEDs to be contacted in a simple manner. This is equivalent to a parallel connection of all LEDs of this arrangement, which has the disadvantage, however, that the currents used to operate the LED arrangement are very high as soon as the matrix, in particular the number of LEDs used in the arrangement, becomes large. However, high currents make the design of such an LED arrangement significantly more complicated and more expensive since, for example, supply leads must be designed for higher currents, which must therefore also be considerably wider, as well as other current-carrying conductors and other components. Alternative arrangements are designed such that all LEDs are connected to each other in series. Thus, the arrangement can be operated with low currents. However, this requires high operating voltages, which can be detrimental to the design of the corresponding voltage source. Further disadvantages can arise if the operating voltage exceeds standardized limits, for example, the limits for extra low voltages (ELV) or safety extra low voltages (SELV).

On the other hand, arrangements are also known such as described in US 2011/0090691 A1, for example, in which a plurality of supply leads are provided to supply current, including, in particular, between the individual LEDs. However, this increased cabling complexity in turn militates against the most compact possible arrangement of the respective LEDs and also increases manufacturing costs.

It could therefore be helpful to provide an LED arrangement that allows a maximally compact arrangement of individual LEDs in the simplest possible way.

SUMMARY

We provide an LED arrangement including a substrate; an electrically conductive first current connection region arranged on the substrate; a second electrically conductive current connection region arranged on the substrate; and a plurality of LEDs that form a plurality of LED groups, wherein each LED has a first LED contact region and a second LED contact region, the LED arrangement includes a plurality of electrically conductive coating regions that are arranged in a manner spatially separated from one another on the substrate, with each contact region being subdivided into a contract region and a transition region adjacent to the contract region, and wherein the second current connection region constitutes one of the transition regions, each LED group is assigned to exactly one of the coating regions such that one of the LED groups is arranged on the contact region of the coating region assigned to the LED group with the result that the first LED contact regions of the respective LEDs contract the contact region of the coating region assigned to their LED group, each transition region of the coating regions is arranged such that it protrudes beyond the edge region, the first current connection region is electrically conductively connected to a second LED contact region of one of the LEDs arranged at the edge region, and, apart from the second current connection region, each transition region is electrically conductively connected to a second LED contract region of one of the LEDs of an adjacent LED group arranged at the edge region, with the result that the plurality of LED groups are connected in series.

We also provide a lighting device having the LED arrangement including a substrate; an electrically conductive first current connection region arranged on the substrate; a second electrically conductive current connection region arranged on the substrate; and a plurality of LEDs that form a plurality of LED groups, wherein each LED has a first LED contact region and a second LED contact region, the LED arrangement includes a plurality of electrically conductive coating regions that are arranged in a manner spatially separated from one another on the substrate, with each contact region being subdivided into a contract region and a transition region adjacent to the contract region, and wherein the second current connection region constitutes one of the transition regions, each LED group is assigned to exactly one of the coating regions such that one of the LED groups is arranged on the contact region of the coating region assigned to the LED group with the result that the first LED contact regions of the respective LEDs contract the contact region of the coating region assigned to their LED group, each transition region of the coating regions is arranged such that it protrudes beyond the edge region, the first current connection region is electrically conductively connected to a second LED contact region of one of the LEDs arranged at the edge region, and, apart from the second current connection region, each transition region is electrically conductively connected to a second LED contract region of one of the LEDs of an adjacent LED group arranged at the edge region, with the result that the plurality of LED groups are connected in series.

LIST OF REFERENCE SIGNS

Figure 1:
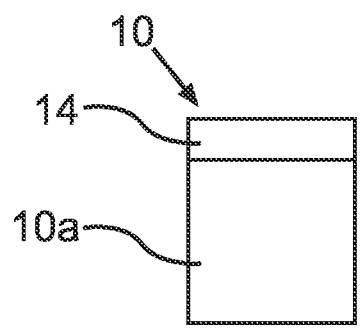
FIG. 1 shows a schematic representation of a plan view of an LED, in particular of its light-emitting side, for an LED arrangement according to an example.

10 LED
10a light-emitting region of the LED
12 first LED contact region
14 second LED contact region
16 substrate
18 coating region
18a contact region
18b transition region
18c auxiliary connection region
20a first current connection region
20b, 20b' second current connection region
22 LED arrangement
24, 24.1 LED group
26 edge region
28, 28' connection
28.1, 28.2 connection
30 LED matrix
32 recess
34 flat element
36 stranded wires
38 bond wire
40a, 40b connection region
50 electrical bridge n number of rows
m number of columns
R direction of rows
S direction of columns

DETAILED DESCRIPTION

Our LED arrangement has a substrate, an electrically conductive first current connection region arranged on the substrate, an electrically conductive second current connection region arranged on the substrate, and a plurality of LEDs that form a plurality of LED groups, each LED of which has a first LED contact region and a second LED contact region. In addition, the LED arrangement comprises a plurality of electrically conductive coating regions that are arranged in a manner spatially separated from one another on the substrate, with each contact region being subdivided into a contact region and a transition region adjacent to the contact region, and wherein the second current connection region constitutes one of the transition regions. Furthermore, each LED group is assigned to exactly one of the coating regions such that one of the LED groups is arranged on the contact region of the coating region assigned to the LED group, with the result that the first LED contact regions of the respective LEDs contact the contact region of the coating region assigned to their LED group. Furthermore, a respective LED group can have at least one LED arranged at an edge region of the entirety of the LED groups. Then, no further LED of the LED arrangement is thus located adjacent to this LED at the edge region, at least on one side of it. In addition, a respective transition region of the coating regions is arranged protruding beyond the edge region, the first current connection region being electrically conductively connected to a second LED contact region of one of the LEDs arranged at the edge region and wherein, apart from the second current connection region, a respective transition region can be electrically conductively connected to a second LED contact region of one of the LEDs of an adjacent LED group that are arranged at the edge region, with the result that the plurality of LED groups are connected in series.

In general, a group of LEDs can contain either a single LED or a plurality of LEDs. According to the LED arrangement, all LEDs of a common LED group are arranged at the same potential since they are all arranged on the same coating region. Ideally, the respective coating regions are then arranged spatially separated from each other, which advantageously enables the individual LED groups to be connected to each other in series. In addition, the interconnection of these individual LED groups is advantageously implemented in the edge region, i.e., by contacting the transition regions protruding beyond the edge region to the second LED contact regions of the respective LEDs arranged at the edge region. Alternatively, and especially in large LED matrix configurations, the interconnection can also be provided in a contacting trench running within the LED arrangement (see below for details). This enables a particularly compact arrangement of the respective LEDs relative to each other, while due to the series connection of the individual LED groups the total current is maintained at a low level, even with a very large number of LEDs. For example, if a single LED were to require a current of 3 A at 3.5 V, then an LED array which has, for example, six LED groups of three LEDs each, will require a current of 9 A at 21 V. If instead these 18 LEDs were arranged, as is standard practice, on a common substrate, i.e., at the same potential, this arrangement would require a current of 54 A, or six times greater. Due to our advantageous arrangement principle of the LEDs and/or LED groups, an arrangement pattern is also advantageously provided which is arbitrarily scalable, with the result that, depending on the application and the requirement, different-sized LED configurations with different numbers of LEDs and controlled current-voltage ratio can be provided in a particularly compact way. In particular, we enable particularly low current-to-voltage ratios to be implemented, even with very high numbers of LEDs. This means that such an LED arrangement can also be provided in a particularly simple and cost-effective way since the individual conductor tracks and other components required can be designed for significantly lower currents. In sum, we therefore make it possible to provide a particularly compact LED arrangement in a particularly simple and cost-effective way.

The LEDs can be any light emitting diode or any kind of light-emitting semiconductor device. This can also be understood to include micro-LEDs, QLEDs, organic light-emitting diodes, superluminescent diodes or the like. However, the LEDs are preferably designed at least such that the first contact region is arranged on an underside of the LED, while the second contact region is arranged on the upper side opposite the underside. This allows the arrangement to be implemented in a particularly compact and controlled way. It is particularly advantageous that most of all of the LEDs are high-current LED chips because they provide particularly high luminance values. Also, such high current LEDs usually have the first contact region on an underside, while the second contact region is arranged on the upper side opposite the underside, for example, on an edge of the light-emitting radiation surface of the LED.

The first and second current connection regions can be used to provide power for the LED array. In particular, the second current connection region that constitutes one of the transition regions, should be understood such that this transition region represents a kind of ideal or special or specific example of the transition regions, which can be coupled to a current connection in any desired way. For this purpose, for example, an additional region, spatially separated from the coating regions, can also be provided as an (additional) second current connection region, which can then be electrically connected to this particular transition region via an electrically conductive connection, for example, a wire, a lead, bond wires, or the like. For the sake of simplicity, in this example this particular transition region is also referred to as a current connection region, in particular as the second current connection region. These two current connection regions are preferably the only current connection regions via which the LED arrangement can be supplied with current. This is particularly advantageous for applications in which individual LEDs or LED groups are not designed to be separately controllable, but it is sufficient if all LEDs of the arrangement can only be controlled simultaneously and in the same way, i.e., they can be switched on and off or dimmed in the same way. This greatly simplifies the construction and, above all, greatly reduces the effort involved in cable routing and contacting, and in particular prevents the crossing of current conductors.

The substrate on which the conductor tracks or the electrically conductive coating regions and the current connection regions are arranged is made in particular of an electrically insulating material, for example, comprising aluminum nitrite, aluminum oxide or the like. As a substrate, a so-called FR4 printed circuit board can also be used, for example, which is made of a low-flammability and flame-retardant composite material that can be formed in particular from epoxy resin and fiberglass fabric. Alternatively, a printed circuit board with a metal core (MC) can also be used for the printed circuit board, or circuit boards with thermally conductive inserts or "inlays" can be used. The electrically conductive coating regions and the current connection regions can be provided in a simple way, for example, by a metallic coating on the substrate.

A neighboring LED group preferably means the closest group of LEDs with respect to a predefined rotation direction, i.e., viewed in a clockwise or counter-clockwise direction, for example.

As mentioned earlier, a group of LEDs can have only a single LED. However, it is preferable that each of the LED groups comprises a plurality of LEDs. This means that LED configurations with a particularly large number of LEDs can be advantageously provided that enables very high luminous densities in an extremely small space.

Therefore, if each of the LED groups contains a plurality of the LEDs, the second LED contact regions of all LEDs of each common LED group are preferably also electrically conductively connected to each other. Thus, both the first LED contact regions of all LEDs of a respective common LED group are electrically connected to each other via the coating region assigned to this LED group and the second LED contact regions are likewise electrically connected by a corresponding electrically conductive connection, with the result that all LEDs of a common LED group are connected in parallel.

Further advantageously, each LED group has exactly the same number of LEDs. This makes it a simple matter to apply the same current to all LEDs, providing a homogeneous and uniform appearance.

Further advantageously, all LEDs of a given common LED group are arranged in a row. Such a linear arrangement allows the contacting of the second LED contact regions to be simplified enormously and hence also a very flat structure to be realized, which will be explained in more detail below.

Furthermore, it is advantageous if the LED groups are arranged relative to one another in a plurality of rows and/or a plurality of columns. Thus, an LED matrix can be provided that can be scaled and modified as desired in terms of its number of rows and/or columns, thus enabling the LED arrangement to be adapted to a wide range of applications and requirements.

In a further advantageous example, at least the transition regions that are different from the second current connection region are bent at an angle so that they each have a first partial region that extends away from the edge region, and a second partial region that directly adjoins the first partial region at an angle, in particular at a right angle, and extends toward the neighboring LED group that comprises the LED, to the second LED contact region of which the relevant edge region is electrically conductively connected. The distance to be bridged by a corresponding contacting element, extending between the second LED contact region of the LED and the respective transition region to which the second LED contact region is electrically conductively connected, can thus be minimized and the contacting can thus be provided in a particularly simple way. The connection effort can thus be further reduced in an advantageous way.

Further advantageously, at least the transition regions that are different from the second connection region are all bent in the same direction, for example, all clockwise or all counter-clockwise with respect to a top view of the LED arrangement. In this way, the respective LED groups can be connected in series in a specified direction of rotation in a particularly simple way.

Furthermore, it is also advantageous if the first current connection region is electrically conductively connected to the second LED contact region of the LED, arranged at the edge region, of the LED group that is adjacent to the LED group comprising the particular coating region having the second current connection region as a transition region. In other words, the two current connection regions are thus assigned to two LED groups that are arranged adjacent to each other. This allows a particularly simple structure to be implemented and, in particular, ensures that conductor tracks do not cross. The series connection can then be realized, for example, starting from the first current connection region and proceeding in a counter-clockwise direction to the second current connection region. This occurs when the first current connection region constitutes the nearest neighbor to the second current connection region in a counter-clockwise direction. Applying this in reverse, the series circuit can be provided just as easily starting from the first current connection region around the entirety of the LED groups in a clockwise direction up to the second connection region.

Particularly advantageously, the LEDs of a respective LED group, located at the edge region that are electrically conductively connected to the transition region of the coating region assigned to the neighboring LED group, are arranged such that at least a part of the respective second LED contact surface is arranged at the edge region. This in turn enables a particularly simple contacting, as a corresponding contact element can be easily routed directly from a transition region to the second LED contact surface at the edge region.

Further advantageously, the second LED contact regions of all LEDs of a respective common LED group are interconnected by an electrically conducting flat element having a height that is less than its length and at most as large as its width or even less than its width. For example, if the flat element is formed as a metal strip, the height may be one or more orders of magnitude smaller, particularly in relation to its length and/or width. Wires or stranded wires can also be used to connect the contact regions, as will be described in more detail below. In this example, its height is at least smaller, in particular by orders of magnitude, than its length and, in particular, may be as large as its width. This allows a particularly flat design to be achieved for the entire LED arrangement. In particular, as a result it is advantageously possible to avoid the use of so-called bond wires, which usually require significantly higher assembly heights. For example, a suitable metal strip can be used as such a flat element. This also reveals the great advantage of the linear arrangement of the LEDs of a common LED group, since this enables the contacting of the respective second LED contact regions to be implemented in a particularly simple way by a metal strip running in a straight line.

Therefore, it represents a further advantageous example if the electrically conductive flat element is designed such that it extends in a straight line across all the second contact regions of the LEDs of the common LED group. In addition, it is advantageous if the flat element is also bent towards the substrate at the edge region and runs toward the transition region of the coating region and is electrically conductively connected to the latter, which is assigned to one of the neighboring LED groups. Provision of the flat element therefore advantageously allows not only the contacting of the second LED contact regions among one another to be performed, but also the connection between the second contact region of the outer LED of an LED group and the corresponding transition region to be made. This also advantageously avoids the use of bond wires to create this contacting and allows a particularly flat structure to be implemented.

Alternatively, however, bond wires that are applied by wire bonding can also be used to contact the second LED contact region of the LED arranged at the edge region of a respective LED group, and the corresponding transition region of the adjacent LED group.

Further advantageously, the second LED contact regions of the LEDs of at least one common LED group are electrically conductively connected to one another by at least one stranded wire that extends essentially in a straight line across all the second contact regions of the LEDs of the common LED group. Also, a plurality of stranded wires extending in parallel, for example, can also be used to contact these second LED contact regions. Their straight-line path again advantageously allows a particularly flat structure to be obtained. In addition, contacting of the second contact regions of the LEDs can be implemented particularly simply.

Preferably, the respective flat elements and/or stranded wires are attached, for example, soldered or glued together with the LEDs in one step. Such flat connections or contacts can significantly increase the robustness of the overall arrangement. Thus, for example, the usual covering can be omitted so that a significantly better coupling of the light emitted by the LED arrangement into a downstream lens can be achieved. In particular, a flat design of the LED arrangement allows a particularly small distance between a light emission surface of the LEDs and a light input surface of the lens that has advantages in terms of the amount of light that can be collected by the lens.

In particular with regard to high operating currents, it may be advantageous to contact all LEDs of the LED arrangement directly as far as possible with one or more auxiliary connection regions that are part of the coating by electrically conducting connections. For LEDs located far away from the edge region, connections can be provided that are dimensioned such that they can bridge over the nearer LED arranged between the remote LED and the transition region ("overbonding"). To cover as little of the light-emitting region of the respective LED as possible, the bridging connections are preferably routed along the edges of the relevant LEDs or in the gaps between the LEDs. Furthermore, the bridging connections are preferably routed such that the respective connection lengths are as short as possible and do not exceed a maximum length of approx. 3 mm.

As an alternative to making a direct connection by bridging, the connection can also be made indirectly by depositing and contacting the connection on the nearer LED and then continuing it to contact the more remote LED. For further details, reference is made to FIGS. 18 to 25 and the corresponding figure descriptions.

For a large LED matrix, for example, with 4×6 LEDs or more, a special strategy is needed to supply current to the LEDs without exceeding a maximum length of the electrically conducting connections, while at the same time sacrificing as little space as possible for the conducting connection.

For this purpose, it is advantageous to provide a contacting trench within the LED arrangement to provide the contacting both with bridging connections and direct connections. For this purpose, transition regions for the respective LED group that are part of the conductive coating regions are arranged alternately in the contacting trench. Such a contacting trench is preferably less than 0.7 mm, preferably less than 0.6 mm or 0.5 mm wide, and should therefore only represent a fraction of the LED dimensions. For further details, reference is made to FIGS. 24 and 25 and the corresponding figure descriptions.

The LED arrangements are particularly suitable for generating monochromatic light. Relevant wavelength ranges can be in the ultraviolet range, in particular in the UV-A range, in the infrared range or in the visible range. Furthermore, the light source can be a white light source. Preferred application areas are imaging optical systems, where a high luminance is required. These can be projection applications or in general, applications where light needs to be focused on a small area. Other applications include curing or hardening applications (e.g., 3D printing, light distribution via DMD) and low-resolution lithography, e.g., for the production of PCBs (e.g., light distribution via DMD). The particular challenge in many applications involves the high electrical currents required during operation, for example, 4 to 5 Ampere or more.

Furthermore, we provide a lighting device having an LED arrangement, or one of its examples. The advantages described in relation to the LED arrangement and its examples thus apply in the same way to the lighting device.

Such a lighting device, for example, a lamp and/or a headlamp having our LED arrangement may be provided and designed for use in lighting effects, entertainment lighting, architectural/entertainment lighting, general lighting, medical and therapeutic lighting, or lighting installations for horticultural use or for use in vehicles.

Further advantages, features and details can be found in the following description of preferred examples and from the drawings. In these, for the sake of simplicity, the same or similar features may also be referred to in the following with the same reference signs.

Figure 2:
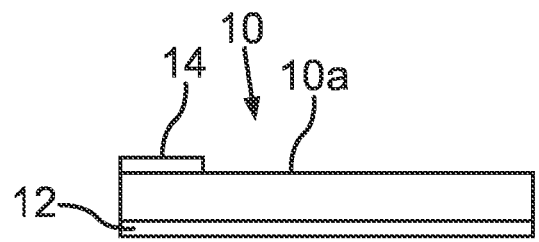
FIG. 2 shows a schematic representation of a side view of the LED of FIG. 1 for an LED arrangement according to an example.

FIG. 1 shows a schematic representation of a plan view of an LED 10, in particular of its light-emitting side, for an LED arrangement 22 (see, e.g., FIG. 4) according to an example. FIG. 2 also shows a schematic representation of this LED 10 in a side view. The LED 10 has a light-emitting region 10a, from which light is emitted during operation of the LED 10. For the connection of a power supply, the LED 10 has an electrically conducting first LED contact region 12 and an electrically conducting second LED contact region 14. These two LED contact regions 12, 14 are arranged on opposite sides of the LED 10, wherein in particular the second LED contact region 14 is located on the side of the LED 10 on which the light-emitting region 10a is also located, while the first LED contact region 12 is arranged on the underside of the LED 10, i.e., the side opposite the light-emitting region 10a. This first LED contact region 12 preferably extends over the entire underside of the LED 10. The second LED contact region 14, on the other hand, extends over only a part of the top of the LED 10, for example, as shown here in a strip-like manner at an edge region of the light-emitting region 10a or, for example, in another region such as only in a corner region of the LED 10, or similar.

Furthermore, the LED 10 is preferably a high-current LED chip because such a high-current LED chip can provide particularly high luminance densities that is particularly advantageous for the preferred application areas of these LED arrangements 22. In general, however, the LEDs 10 can each be implemented as any type of LED, or generally, as any type of light-emitting semiconductor device.

Figure 3:
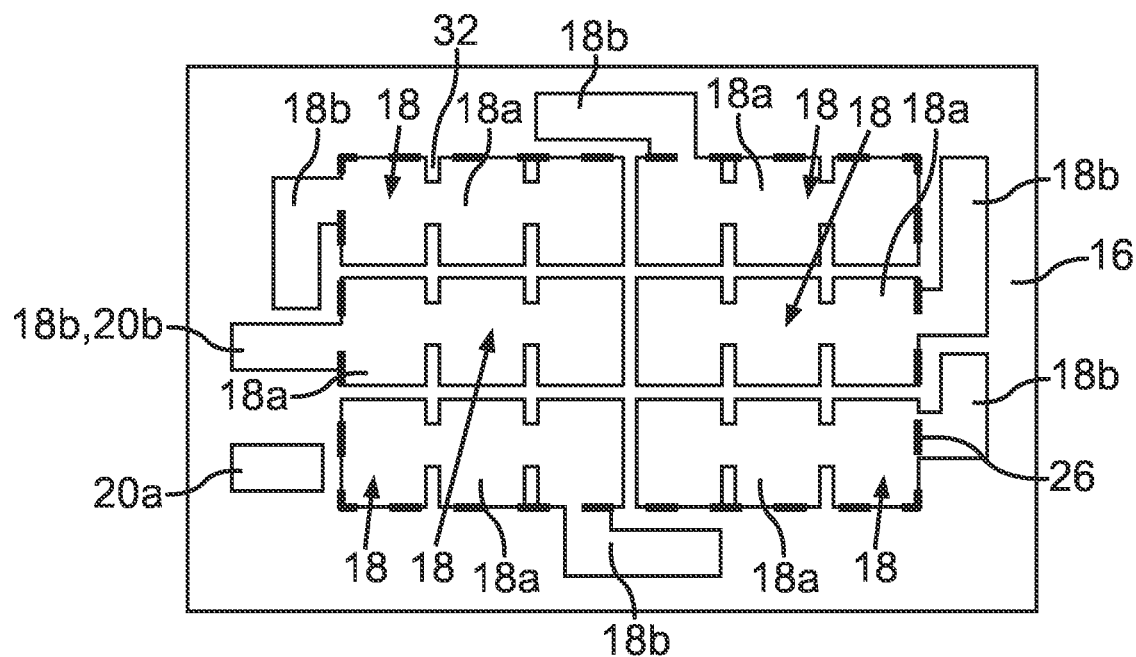
FIG. 3 shows a schematic representation of a plan view of a substrate with coating regions and current connection regions arranged thereon, for an LED arrangement according to an example.

FIG. 3 shows a schematic representation of a plan view of an electrically insulating but preferably highly thermally conducting substrate 16, with coating regions 18 and two current connection regions 20a, 20b arranged on it, for an LED arrangement 22 according to an example. The corresponding LED arrangement 22 with the LEDs 10 arranged on the respective coating regions 18 is shown schematically in FIG. 4.

The LED arrangement 22 comprises a plurality of LED groups 24. Each LED group 24 comprises at least one LED 10, in this example three LEDs 10 per group. In addition, exactly one coating region 18 is assigned to each LED group 24. Accordingly, the LED arrangement 22, as can be seen from FIG. 3, comprises six spatially separated coating regions 18 made from an electrically conductive material. Each coating region 18 is further subdivided into a contact region 18a and a transition region 18b. The LEDs 10 of a respective LED group 24 are arranged with their respective first LED contact regions 12 contacting on the contact region 18a of the respective coating region 18 assigned to their LED group 24. No LEDs are arranged on the transition regions 18b of the coating regions 18 themselves. These transition regions 18b are thus arranged protruding beyond an edge region 26 of the whole set of the LED groups 24, this edge region 26 being illustrated in FIG. 3 by a dashed line, which thus bounds the outward extent of the totality of the arrangement of all LEDs 10 of the LED arrangement 24 in the plan view shown of the light-emitting side.

Furthermore, the LED arrangement 24 also comprises two current connection regions 20a, 20b, namely a positive first current connection region 20a that is also spatially separated from the other coating regions 18, and a second negative current connection region 20b, which simultaneously provides a transition region 18b of one of the coating regions 18. This second current connection region 20b, which represents a specific one of the transition regions 18b, should be understood such that it can only be connected to a current connection in some way. For this purpose, for example, an additional region, spatially separated from the coating regions, can also be provided as an (additional) second current connection region 20b' (cf. FIG. 4), which can then be electrically connected to this particular transition region 18b, 20b via an electrically conducting connection 28', for example, a wire, a lead, bond wires or the like. For the sake of simplicity, in this example also this particular transition region 18b is also referred to as a current connection region 20b, in particular as the second current connection region 20b.

Figure 4:
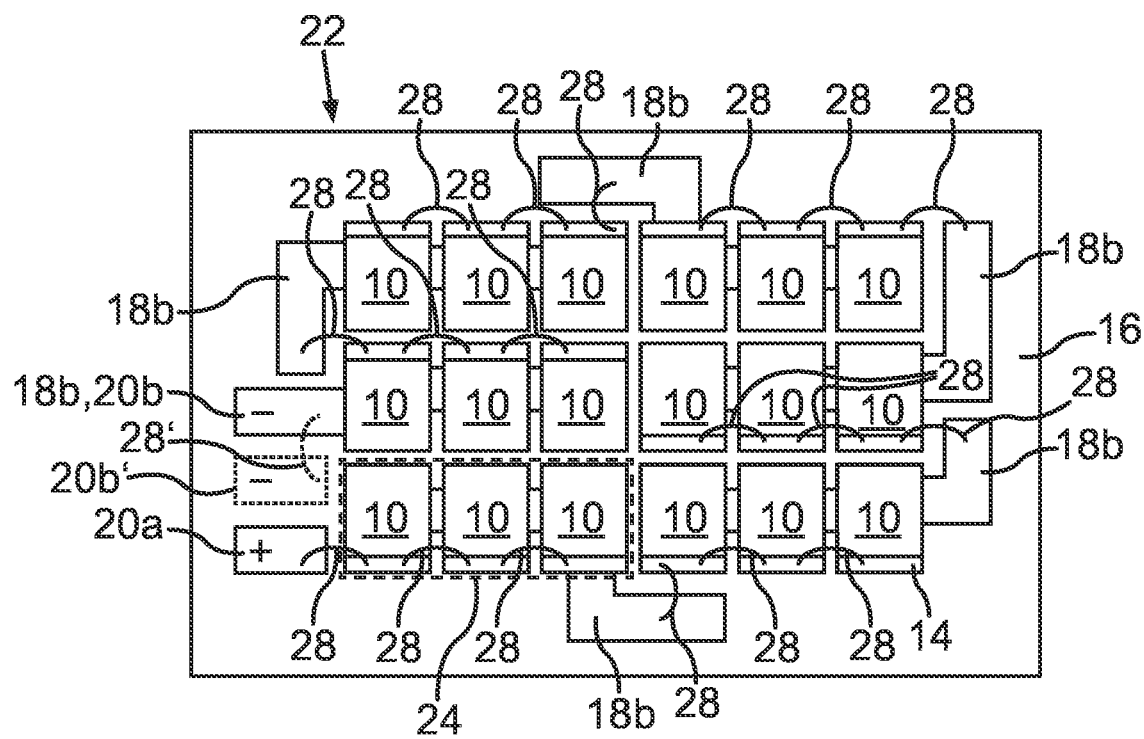
FIG. 4 shows a schematic representation of a plan view of an LED arrangement with LEDs arranged on the coating regions as shown in FIG. 3 and that are schematically contacted on the upper side via connecting elements, according to an example.

A respective LED group 24 additionally has at least one LED 10 arranged at the edge region 26. This LED 10 can thus be used in a simple way to provide the contacting to the neighboring LED group 24, or the first current connection region 20a. The interconnection of the LEDs to one another is also shown in FIG. 4 in particular. These contacting connections are labeled as 28 in FIG. 4. On the one hand, such connections 28 are used to electrically conductively connect the second LED contact regions 14 of the LEDs 10 of a common LED group 24 to one another, on the other hand, via such a connection 28 the second LED contact region 14 of the LED 10 of a respective LED group 24 arranged at the edge region 26 is connected to the transition region 18b assigned to an adjacent LED group 24, which is true for all LED groups 24 except one, in which the at least one LED 10 arranged at the edge region 26 is connected to the first current connection region 20a.

The LEDs 10 can be designed as described in relation to FIGS. 1 and 2 and in this example have their second LED contact region 14 arranged facing the substrate 16, wherein for reasons of clarity only one such second LED contact region 14 is labeled with a reference sign.

Due to such an LED arrangement 22, it is possible to provide a series connection of the individual LED groups 24 to each other, in fact in a particularly compact manner. The LEDs 10 within a common LED group 24 are connected in parallel to each other, since both their respective first LED contact regions 12 are connected to each other by way of their coupling via the respective contact regions 18a of the respective coating regions 18, and their respective second LED contact regions 14 are connected to each other via the connections 28 and are therefore at the same potential. The series connection or series connections of the individual LED groups 24 allows the total current required to operate the LEDs 10 to be significantly reduced, in particular compared to when all LEDs 10 are connected in parallel to each other and arranged at a common potential, also known as common ground, as is standard practice. The total current required therefore now only depends on how many LEDs 10 are arranged in an LED group 24, not on how many LED groups 24 are provided in total. For example, if an LED 10 requires a current of 3 A (Ampère), and if every LED group 24, as shown in FIG. 4, for example, has three LEDs 10 each, this results in a total current required for this entire LED arrangement 22 of 9 A. If, for example, more or less than the six LED groups 24 shown here are provided, the required total current would not change. We therefore advantageously make it possible to also operate LED configurations 22 with a very high number of LEDs 10 with relatively low total currents. This has the great advantage that the LED arrangement 22 can be designed to be much simpler and more cost-effective since, for example, all current-carrying leads and coatings can be designed for significantly lower currents, along with any optional additional electrical or electronic components that are or can be coupled with the LED arrangement 22.

However, another particularly great advantage is that this arrangement, despite the series connection of the respective LED groups 24, makes it possible to arrange the individual LEDs 10 with respect to each other in an extremely compact manner. This is mainly made possible by the fact that the contacting of the LED groups 24 with one another for implementing the series connection is implemented in the edge region 26, or beyond this and surrounding it, in particular by the transition regions 18b surrounding the arrangement of the LEDs 10 so that such contacting regions advantageously do not need to be arranged between the individual LEDs. Thus, the individual LEDs 10 can be arranged very closely to each other, ideally even touching.

Figure 5:
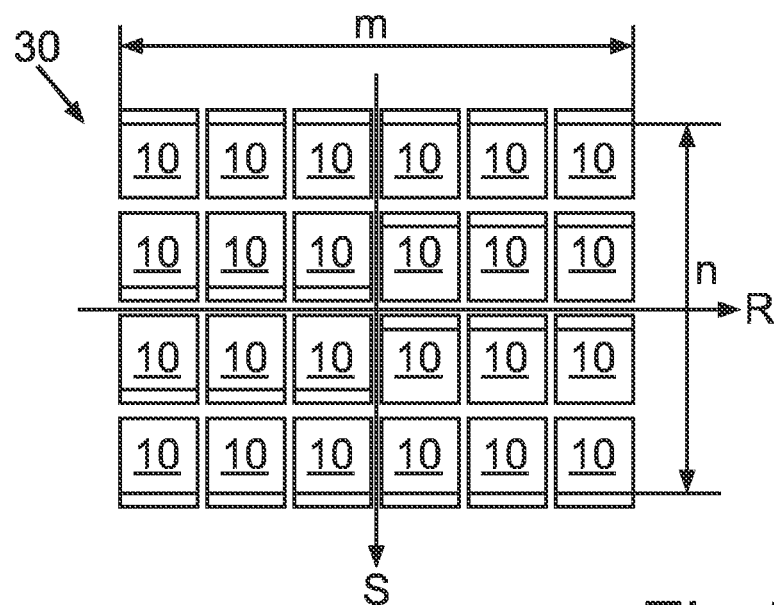
FIG. 5 shows a schematic representation of a plan view of an LED matrix having a plurality of LEDs for an LED arrangement according to an example.
Figure 6:
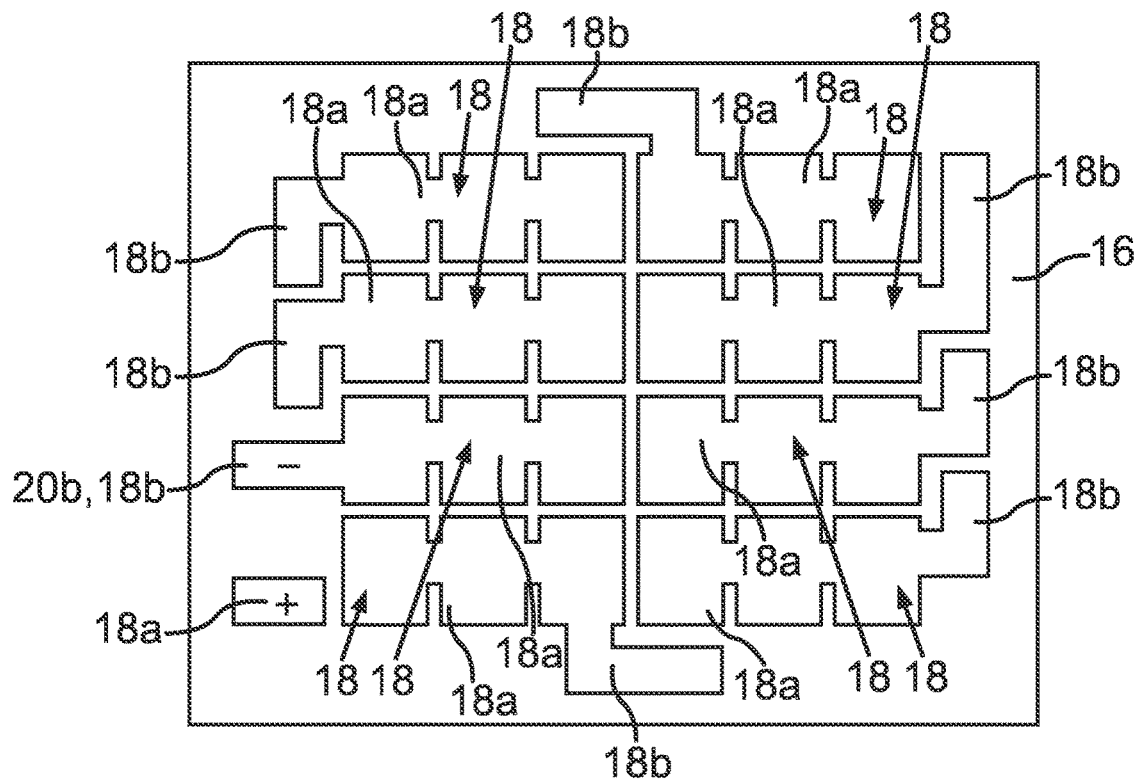
FIG. 6 shows a schematic representation of a plan view of a substrate with coating regions and current connection regions arranged thereon, for an LED arrangement according to another example.

In addition, this arrangement concept can be extended, reduced and modified in any way, i.e., it can be arbitrarily scaled as required, an example of which is illustrated in FIG. 5. FIG. 5 shows a schematic representation of a plan view of an LED matrix 30 having a plurality of LEDs 10 for an LED arrangement 22 according to an example. This LED matrix 30 now has a plurality of rows and columns, in particular n rows and m columns. The rows extend in the direction indicated by R, while the columns extend in the direction indicated by S. The arrangement of the coating regions 18 and the current connection regions 20a, 20b on the substrate 16 corresponding to this LED matrix 30 is shown in FIG. 6. In this example, the LED matrix 30 thus has eight LED groups 24, wherein a given LED group 24 has three LEDs 10. Two LED groups 24 are arranged next to each other in each row. The total current I required for this arrangement is again obtained from the number of LEDs 10 per LED group 24, multiplied by the current I0 for a single LED 10. Therefore, since in this arrangement a respective LED group 24 has exactly half as many LEDs 10 as are arranged in a row, the required total current I is obtained as follows:

$$I=m/2 \cdot I0.$$

The total voltage U required is obtained from the required voltage U0 for a single LED 10 multiplied by the number of LED groups 24. According to this arrangement, there are exactly twice as many LED groups 24 as rows, as two LED groups 24 are arranged per row. Accordingly, the total voltage U required is obtained as:

$$U=2n \cdot U0.$$

This arrangement can now advantageously be extended in either direction, i.e., in the direction of the rows R and in the direction of the columns S. An extension of this arrangement in the direction of the columns S can be implemented, for example, in a simple way by arranging one or more further LED rows in the direction S, wherein each row again has 2 LED groups 24. Thus, if this arrangement is extended in this manner in the direction S of the columns, the above formulas for calculating the total current I and the total voltage U remain unchanged.

This arrangement can also be extended as desired in the direction R of the rows A. This can be achieved, for example, by increasing the number of LEDs 10 per LED group 24. For example, each row of LEDs then additionally comprises exactly two LED groups 24, but where a given LED group 24 then has, for example, four LEDs 10 or five LEDs 10 or six LEDs 10 or the like. In this example also, the formulas for calculating the total current I and the total voltage U remain unchanged and continue to be valid.

This scheme therefore offers arbitrary extension possibilities and thus a particularly high degree of flexibility.

Figure 7:
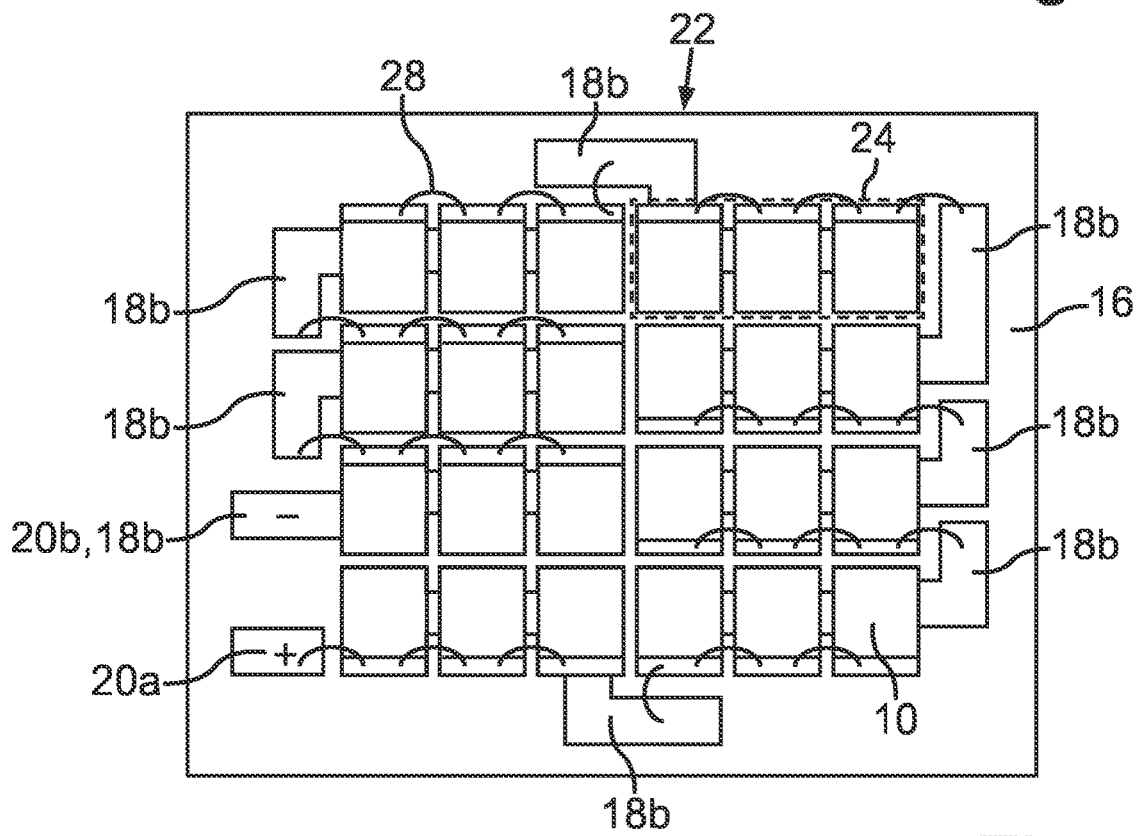
FIG. 7 shows a schematic representation of a plan view of an LED arrangement with LEDs arranged on the coating regions as shown in FIG. 6 and which are schematically contacted on the upper side via connecting elements, according to an example.

FIG. 6 shows, as already mentioned, a schematic representation of the plan view of a substrate 16 with coating regions 18 and current connection regions 20a, 20b again arranged thereon for an LED arrangement 22 according to another example. In particular, this arrangement of the coating and current connection regions 18, 20a, 20b is suitable, for example, for the LED matrix 30 shown in FIG. 5. The arrangement of these LEDs 10 according to this LED matrix 30 shown in FIG. 5 on the respectively assigned coating regions 18 is shown schematically in plan view in FIG. 7. For reasons of clarity, in FIG. 7 only a single LED 10 is labeled with a reference sign, as well as only a single connection 28. In addition, this LED arrangement 22 is designed as described in relation to FIG. 4, with the difference that in this example shown in FIG. 7 the LED arrangement 22 now has eight LED groups 24 with three LEDs 10 each, while the LED arrangement 22 of FIG. 4 has six LED groups 24 of three LEDs 10 each. The series connection of the individual LED groups 24 in this example shown in FIG. 7 is also implemented advantageously by the transition regions 18b around the periphery of the arrangement that are each electrically conductively connected to an LED 10 arranged in the boundary region 26 of an adjacent LED group 24 by a corresponding connection 28.

Furthermore, it is advantageous if the LEDs 10 of a common LED group 24 are arranged relative to each other such that their respective second LED contact regions 14 lie on a straight line, as this simplifies the contacting between the LEDs 10, as described in more detail below.

Figure 8:
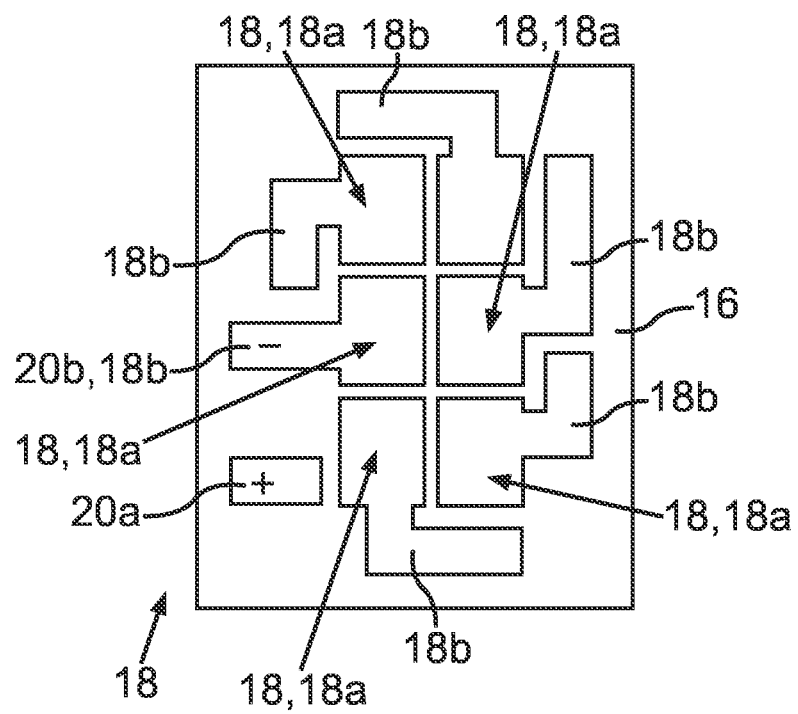
FIG. 8 shows a schematic representation of a plan view of a substrate with coating regions and current connection regions arranged thereon, for an LED arrangement according to another example.
Figure 9:
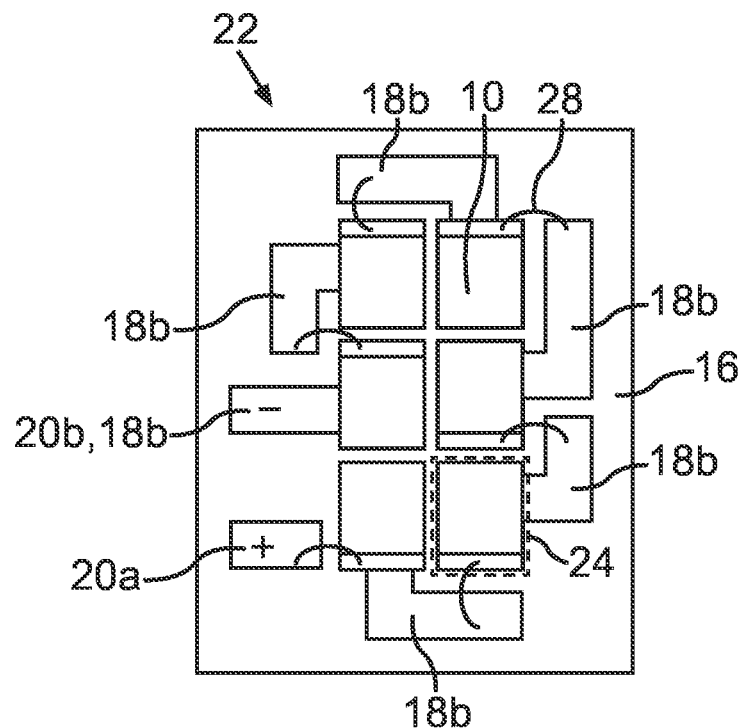
FIG. 9 shows a schematic representation of a plan view of an LED arrangement with LEDs arranged on the coating regions as shown in FIG. 8 according to an example.

FIG. 8 shows another example of a possible arrangement of coating regions 18 on a substrate 16 for an LED arrangement 22, as shown schematically in FIG. 9 in a plan view, with the LED groups 24 assigned to each of the coating regions 18. In this example, each individual LED group 24 has only one LED 10. This means six LED groups 24 are provided, with exactly one LED 10 each. In addition, here again the contacting can also be implemented as described above.

Figure 10:
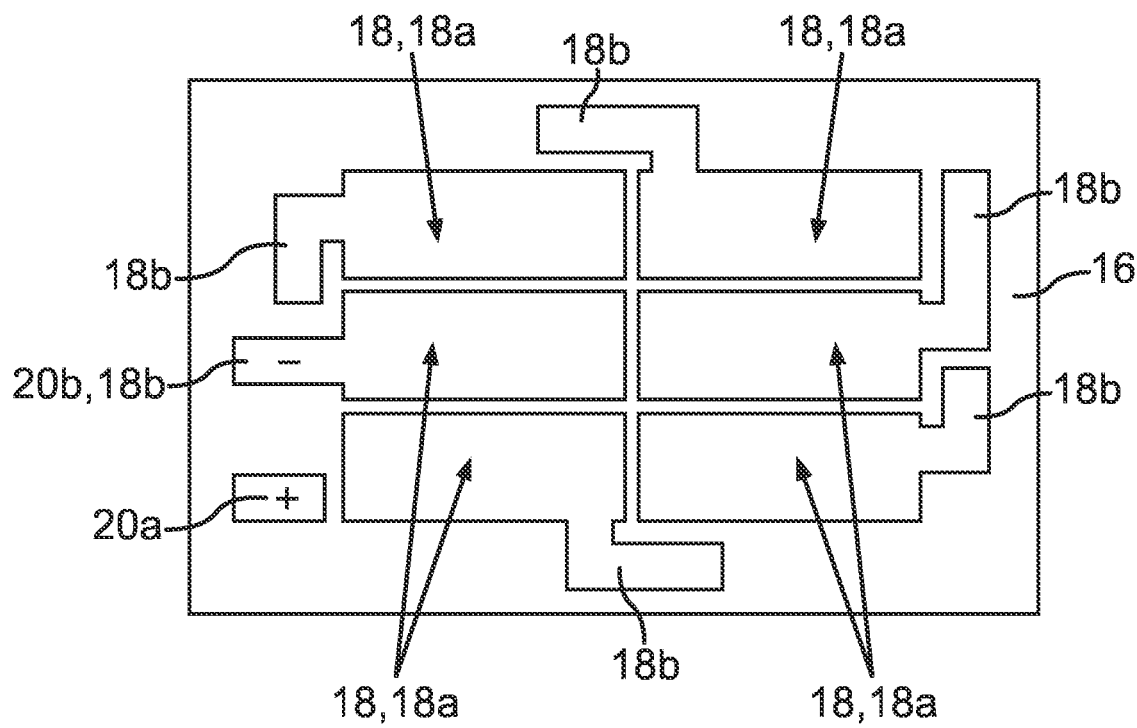
FIG. 10 shows a schematic representation of a plan view of a substrate with coating regions and current connection regions arranged thereon, for an LED arrangement according to another example.
Figure 11:
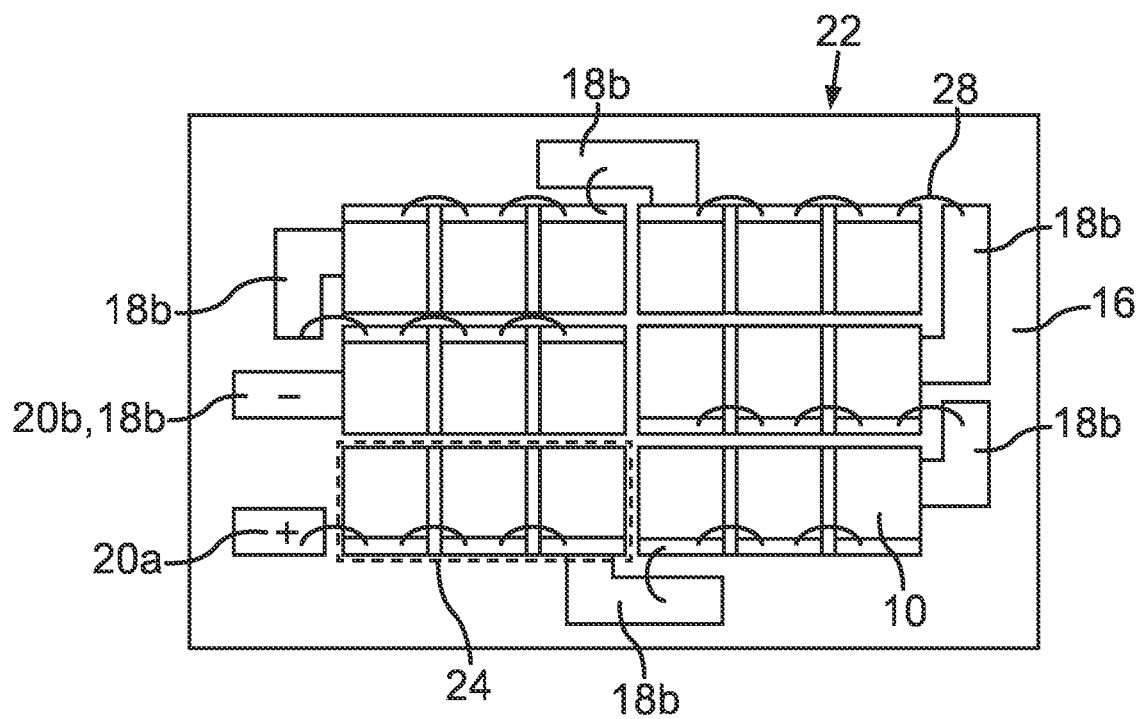
FIG. 11 shows a schematic representation of a plan view of an LED arrangement with LEDs that are arranged on the coating regions as shown in FIG. 10 and schematically contacted on the upper side via connecting elements according to an example.

FIG. 10 shows a schematic representation of a plan view of a substrate 16 with coating regions 18 arranged on it and with current connection regions 20a, 20b for an LED arrangement 22 as shown in FIG. 11, with LEDs arranged on it, which in this example again has six LED groups 24 of three LEDs 10 each. This LED arrangement 22 can again be formed as described in relation to FIGS. 3 and 4, in particular with the difference that the contact regions 18a are now each rectangular in shape, without notches or recesses 32 between two positions that are each provided for an LED 10. Such recesses 32 are shown in FIG. 3.

By forming the contact regions 18a without such recesses 32, it becomes possible to arrange the respective LEDs 10 of a respective group 24 to be floating on the respective coating regions 18 and thus to further minimize the distances between the respective LEDs 10. In particular, they can also be arranged in contact, which means that they are even touching each other, at least in part.

As can be seen from the preceding examples, there are an unlimited number of arrangement options and design options of these LED configurations 22. This can thus have any number of LED groups 24, and each LED group 24 can have any number of LEDs 10. However, it is preferable that each LED group 24 comprises exactly the same number of LEDs. The possible configurations are therefore not limited to the examples shown here. For example, each of these illustrated examples can be implemented in the same way but in reflection.

Figure 12:
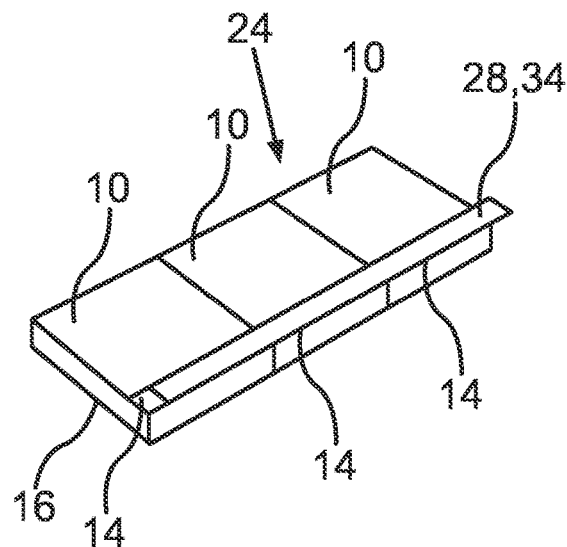
FIG. 12 shows a schematic and perspective view of an LED group for an LED arrangement according to an example, wherein the LEDs of the LED group are contacted to one another by an electrically conducting flat element running in a straight line.
Figure 13:
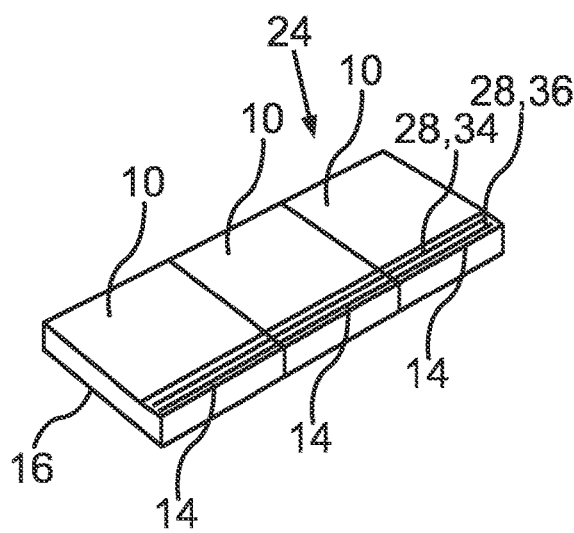
FIG. 13 shows a schematic and perspective view of an LED group for an LED arrangement according to an example, wherein the LEDs of the LED group are contacted to one another by two stranded wires running in a straight line.
Figure 14:
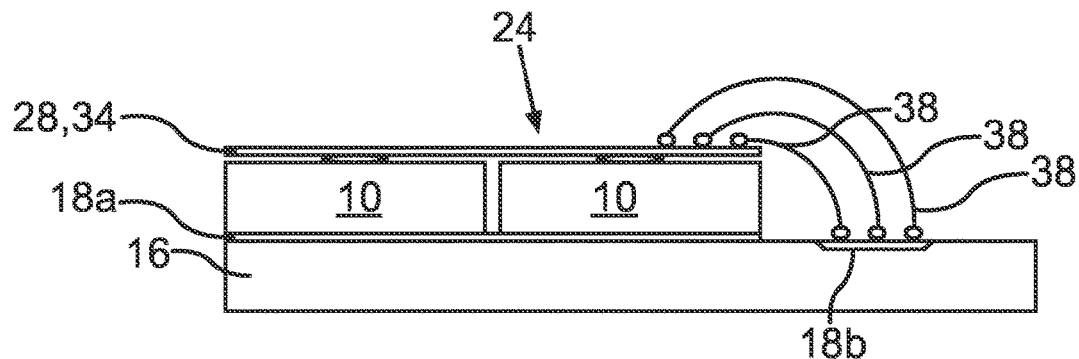
FIG. 14 shows a schematic representation of a side view of an edge region of an LED arrangement according to an example in which the contacting between the second LED contact regions of an LED group with the transition region assigned to a neighboring LED group is implemented by bond wires.
Figure 15:
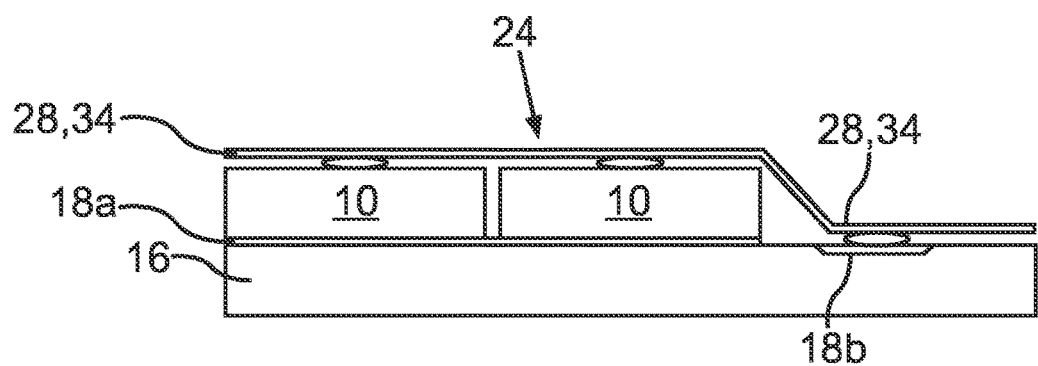
FIG. 15 shows a schematic representation of a side view of an edge region of an LED arrangement according to an example in which the contacting between the second LED contact regions of an LED group with the transition region assigned to a neighboring LED group is implemented by the electrically conducting flat element that also connects the second LED contact regions of an LED group to one another.

FIG. 12 shows a schematic and perspective view of an LED group 24 for an LED arrangement 22 according to an example, wherein the connections 28 for contacting the respective second LED contact regions 14 are implemented by an electrically conducting flat element 34 running in a straight line. FIG. 13 also shows a schematic and perspective representation of an LED group 24 for an LED arrangement 22 according to another example, in which the respective second LED contact regions 14 are realized by connections 28, which in this example are formed as two electrically conducting stranded wires 36 running in a straight line. In both examples, these connections 28 can provide a particularly flat structure, in particular in contrast to the use of bond wires. For example, the use of bond wires 38 can thereby be limited to the connections 28 to the corresponding transition regions 18b, as illustrated schematically, for example, in FIG. 14 in a side view of a part of the LED arrangement 22. Alternatively, the contacting to the transition regions 18b can be provided, for example, by the flat element 34 itself, which is bent toward the substrate 16 in the edge region 26 and which is also used to contact the second LED contact regions 14 of a common LED group 24, as shown schematically in FIG. 15. Especially in the latter example, a particularly flat structure of the LED arrangement 22 can also be provided in the edge region.

By using such flat connections 28 that are provided by flat elements 34 or stranded wires 36, a particularly robust arrangement can also be provided, and in addition a standard cover can be omitted, which enables better coupling properties of the emitted light into a subsequent lens.

Overall, the examples show how we provide an LED arrangement that is designed for maximum package density with maximum luminance and can also provide a balanced ratio between voltages and total current by not placing all LEDs of the array at a common potential, and in which the tracks still do not cross. In addition, a very flat structure of the arrangement can be implemented by the very flat connections between the LEDs.

Figure 16:
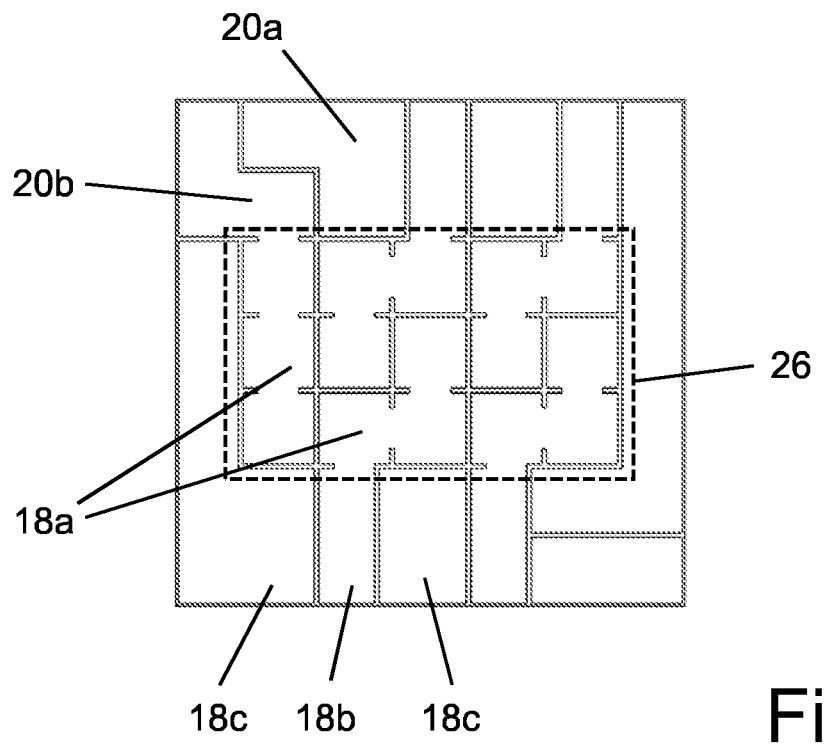
FIG. 16 shows a schematic representation of a plan view of a substrate with coating regions and current connection regions arranged thereon, for an LED arrangement according to another example.

FIG. 16 shows a schematic representation of a plan view of an electrically insulating, but preferably highly thermally conducting substrate 16 (see FIG. 17; not shown in FIG. 16) with coating regions 18a (contact regions), 18b (transition regions) and 18c (auxiliary connection region) and two current connection regions 20a, 20b arranged on it for an LED arrangement 22 according to an example. The corresponding LED arrangement 22 with the LEDs 10 arranged on the respective coating regions 18a is shown schematically in FIG. 17. For the operation of the LED arrangement 22, the current connection regions 20a, 20b are each connected to corresponding connection regions 40a, 40b of an electrical supply unit (not shown).

The auxiliary connection regions 18c are designed such that the LEDs of a group can be connected to each other via the respective adjoining auxiliary connection region 18c, i.e., they need not be directly interconnected by bond wires. This is particularly advantageous when high total currents are present. The electrically conductive connections 28.1 (e.g., bond wires) through which only the partial currents of the respective LED flow are provided for contacting the LEDs 10.1 arranged in the edge region 26 to the associated auxiliary connection region 18c. The LEDs 10.2 that are further away from the edge region 26 are connected to the nearest suitable auxiliary connection region 18c by the electrically conductive connections 28.2. The connections 28.2 are dimensioned such that they can bridge the particular LED 10.1 arranged between LED 10.2 and the auxiliary connection region 18c ("overbonding").

The electrical bridges 50 are used to provide the electrical interconnection of two adjacent auxiliary connection regions 18c and alternatively, by removing the bridges 50, offer the simple facility to configure a multi-channel light source, for example, a 5-channel light source, if required.

Figure 17:
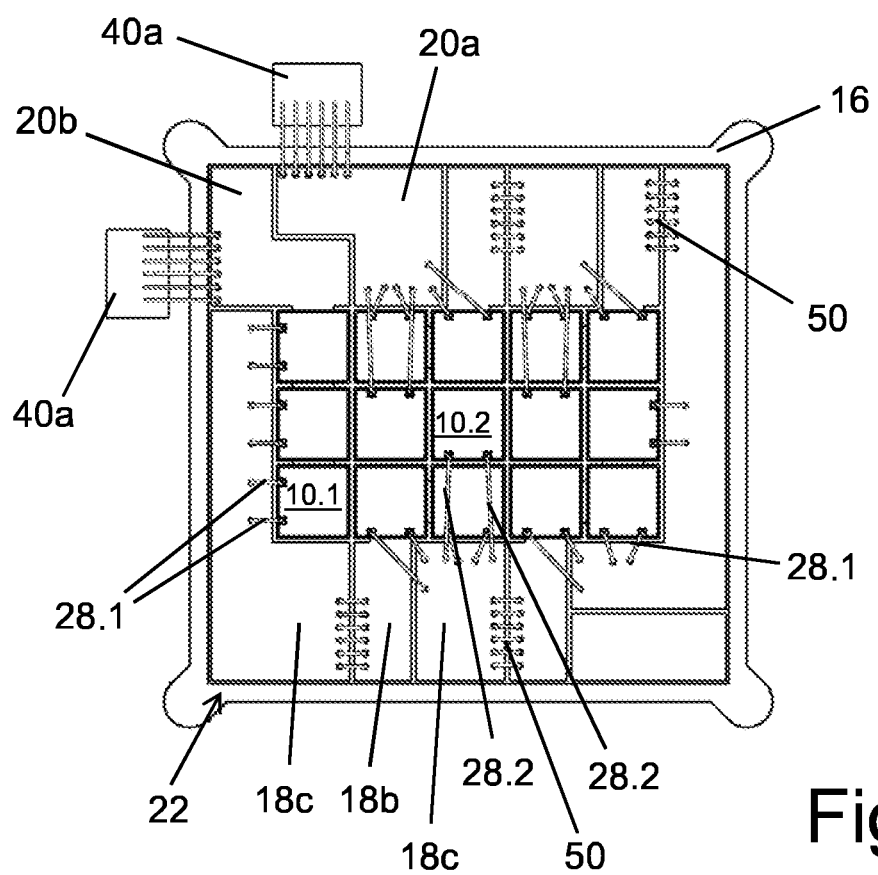
FIG. 17 shows a schematic representation of a plan view of an LED arrangement with LEDs that are arranged on the coating regions as shown in FIG. 16 and schematically contacted on the upper side via connecting elements, according to an example.
Figure 18:
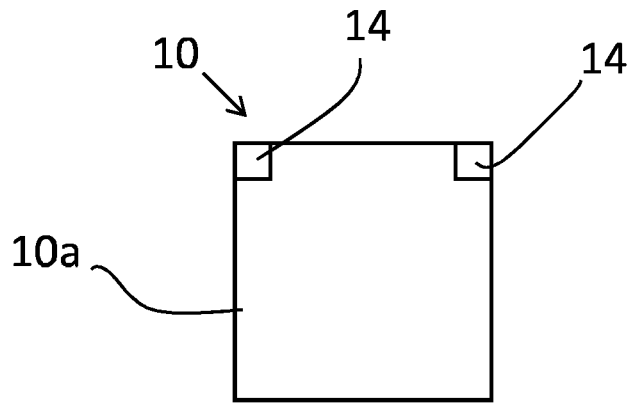
FIG. 18 shows a schematic representation of a plan view of an LED, in particular of its light-emitting side, for an LED arrangement according to an example.
Figure 19:
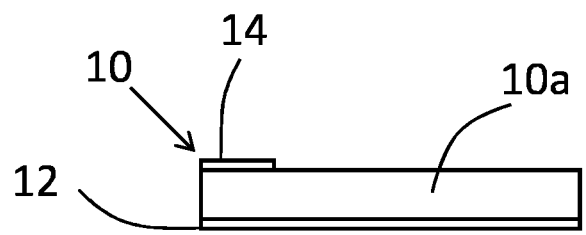
FIG. 19 shows a schematic representation of a side view of the LED of FIG. 18 for an LED arrangement according to an example.

FIG. 18 shows a schematic representation of a plan view of an LED 10 (10.1 or 10.2), in particular of its light-emitting side, for the LED arrangement 22 according to an example shown in FIG. 17. FIG. 19 also shows a schematic representation of this LED 10 in a side view.

The contact regions 14 are designed such that only one electrically conducting connection 28 can be accommodated at a time. As a rule, both contact regions are occupied to operate an LED 10. An electrical connection from an electrical contact region of a first LED to an electrical contact region of a second LED (as shown in FIG. 7) is not advantageous in high current loads.

Figure 20:
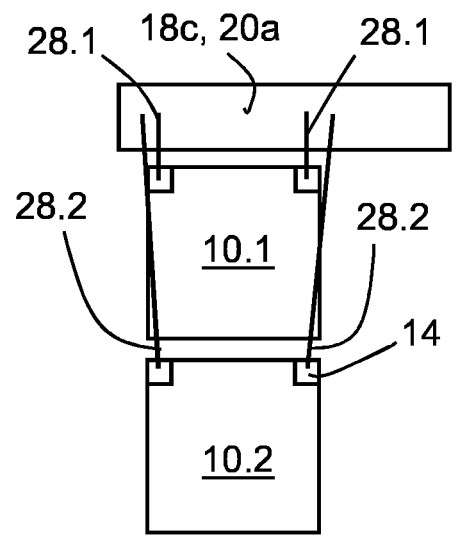
FIG. 20 shows a schematic representation of a plan view of two LEDs of an LED group for an LED arrangement according to an example, wherein the second LED of the LED group is contacted to the current connection region by overbonding of the first LED.

One solution to this problem is to provide one or more auxiliary connection regions 18c, thus directly connecting the LEDs that are not arranged at the edge region by overbonding, as already mentioned in the description of FIG. 17. FIG. 20 shows a schematic diagram of the overbonding principle. The electrically conducting connections 28.2 of the LED 10.2 are preferably arranged along the edge of the overbonded LED 10.1 and connected to the auxiliary connection region 18c or the current connection region 20a. The length of the electrically conducting connections should be as short as possible, preferably shorter than 3 mm in each example.

Figure 21:
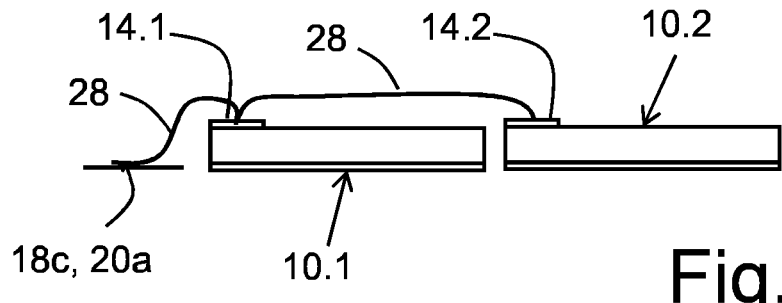
FIG. 21 shows a schematic representation of a side view of two LEDs of an LED group for an LED arrangement according to an example, wherein the second LED of the LED group is contacted to the first current connection region by depositing a conducting connection on the first LED.

FIG. 21 shows a schematic drawing of an alternative means of connecting LEDs 10.2 located far from the edge region to an auxiliary connection region 18c or a current connection region 20a. For this purpose, an electrically conducting connection to the auxiliary connection region 18c or current connection region 20a, e.g., a bond wire, is deposited, i.e., contacted, on a contact region 14.1 of the first LED 10.1 and then routed onto a contact region 14.2 of a second LED 10.2 and deposited again, in other words contacted.

Figure 22:
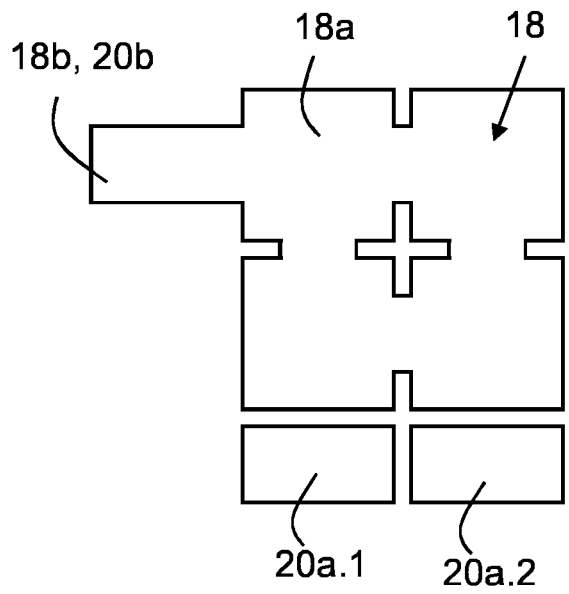
FIG. 22 shows a schematic representation of a plan view of coating regions and current connection regions for a channel separation for an LED arrangement according to another example.
Figure 23:
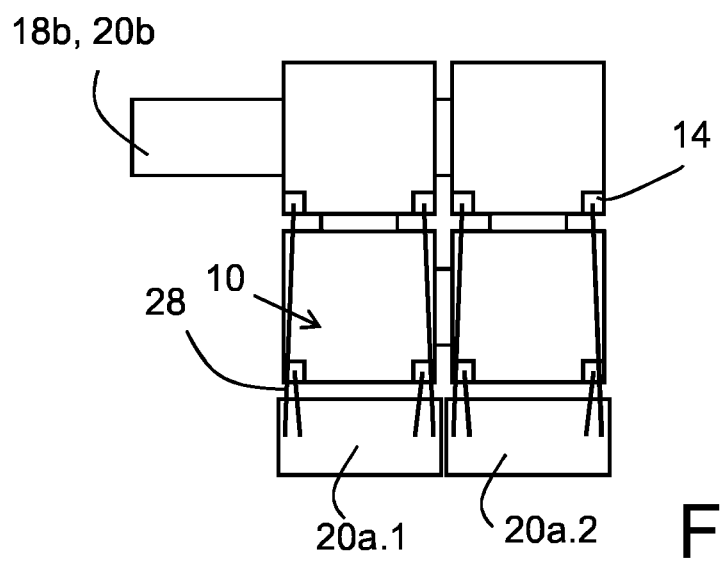
FIG. 23 shows a schematic representation of a plan view of an LED arrangement with LEDs arranged on the coating regions as shown in FIG. 22 and schematically contracted on the upper side via connecting elements, according to an example.

FIG. 22 shows a schematic drawing of an example of a coating region 18 and current connection regions 20a.1, 20a.2 with channel separation. FIG. 23 shows schematically the arrangement corresponding to FIG. 22 with LEDs 10 that are connected at their LED contact regions 12 (not visible here) via the coating region 18a. The channel separation is implemented here by two separate current connection regions 20a.1 or 20a.2, to which the contact regions 14 of the LEDs of a respective channel are contacted via electrically conducting connections 28. A corresponding configuration can be created in FIG. 17, for example, by removing one or more of the bridges 50 or leaving them out altogether.

The advantage of this structure is that larger LED matrices n×m (n>5 and m>5) can be easily contacted from the rear and operated simultaneously with different currents on different channels.

Figure 24:
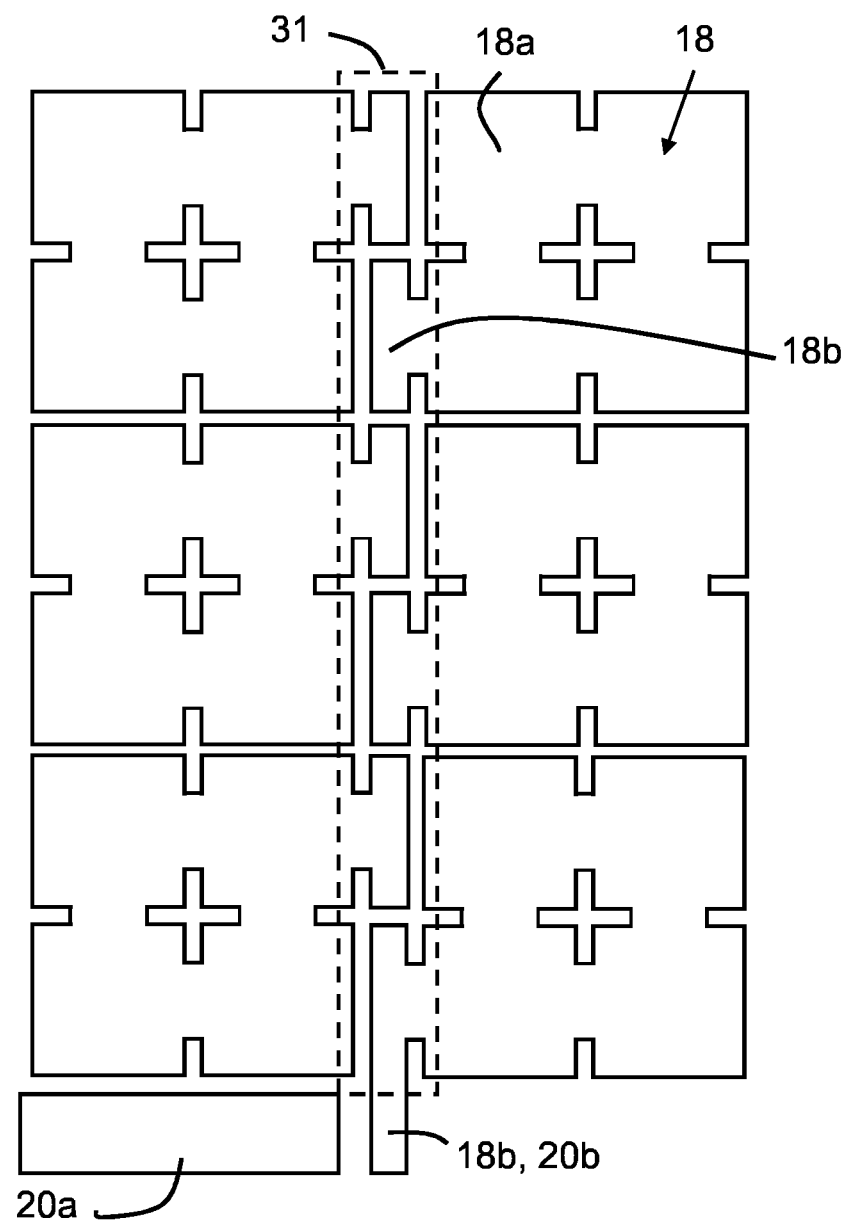
FIG. 24 shows a schematic representation of a plan view of coating regions and current connection regions for an LED arrangement having many LEDs, according to another example.
Figure 25:
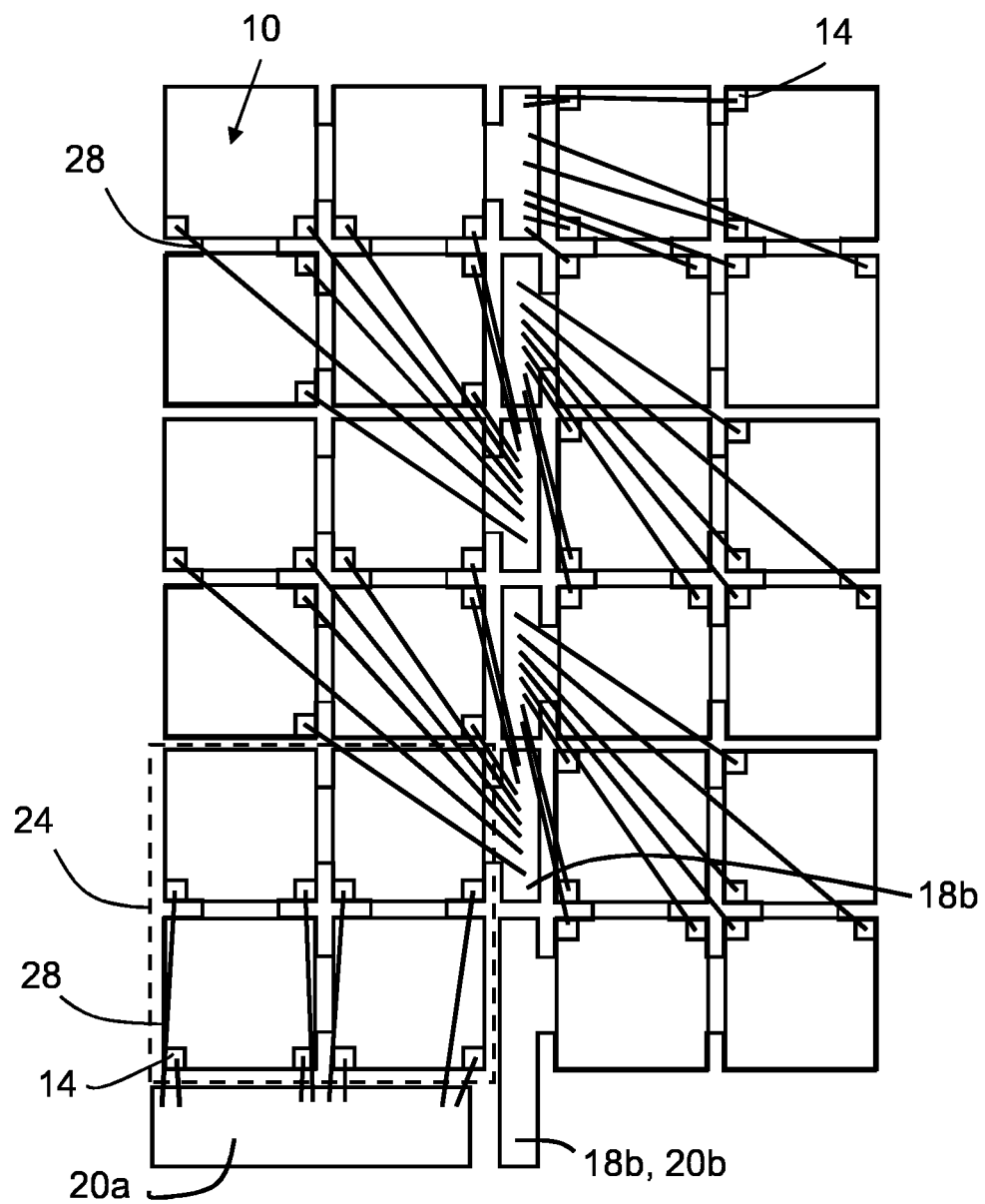
FIG. 25 shows a schematic representation of a plan view of an LED arrangement with LEDs arranged on the coating regions as shown in FIG. 24 and schematically contacted on the upper side via connecting elements, according to an example.

FIG. 24 shows a schematic representation of a plan view of coating regions and current connection regions for an LED arrangement having many LEDs (here 4×6), according to another example. The corresponding LED arrangement 22 with the LEDs 10 arranged on the respective coating regions 18 is shown schematically in FIG. 25.

For a large LED matrix, a special strategy is needed to supply current to the LEDs without exceeding a maximum length of the electrically conducting connections 28 while at the same time sacrificing little space for the conducting connection.

For this purpose, a contacting trench 31 is provided in which transitional regions 18b for the respective LED group that are part of the conductive coating regions 18 are arranged alternately. Such a contacting trench is preferably less than 0.7 mm, preferably less than 0.6 mm or 0.5 mm wide, and should therefore only represent a fraction of the LED dimensions.

The electrical connection is implemented (see FIG. 24 in conjunction with FIG. 25) such that one or more LEDs are applied to a contact region 18a. A plurality (in this example 3×2) of LED groups 24 are created (only one example being highlighted by a dashed line).

A first LED group is connected to the connection region 20a via the contact regions 14 using electrically conducting connections 28. The second LED group is connected to the transition region 18b belonging to the first LED group or the like. The transition region of the last contact region in the chain is then the connection region 20b. The second half of the LED groups is placed next to the first half so that the first and last LED groups are next to each other.

Figure 26:
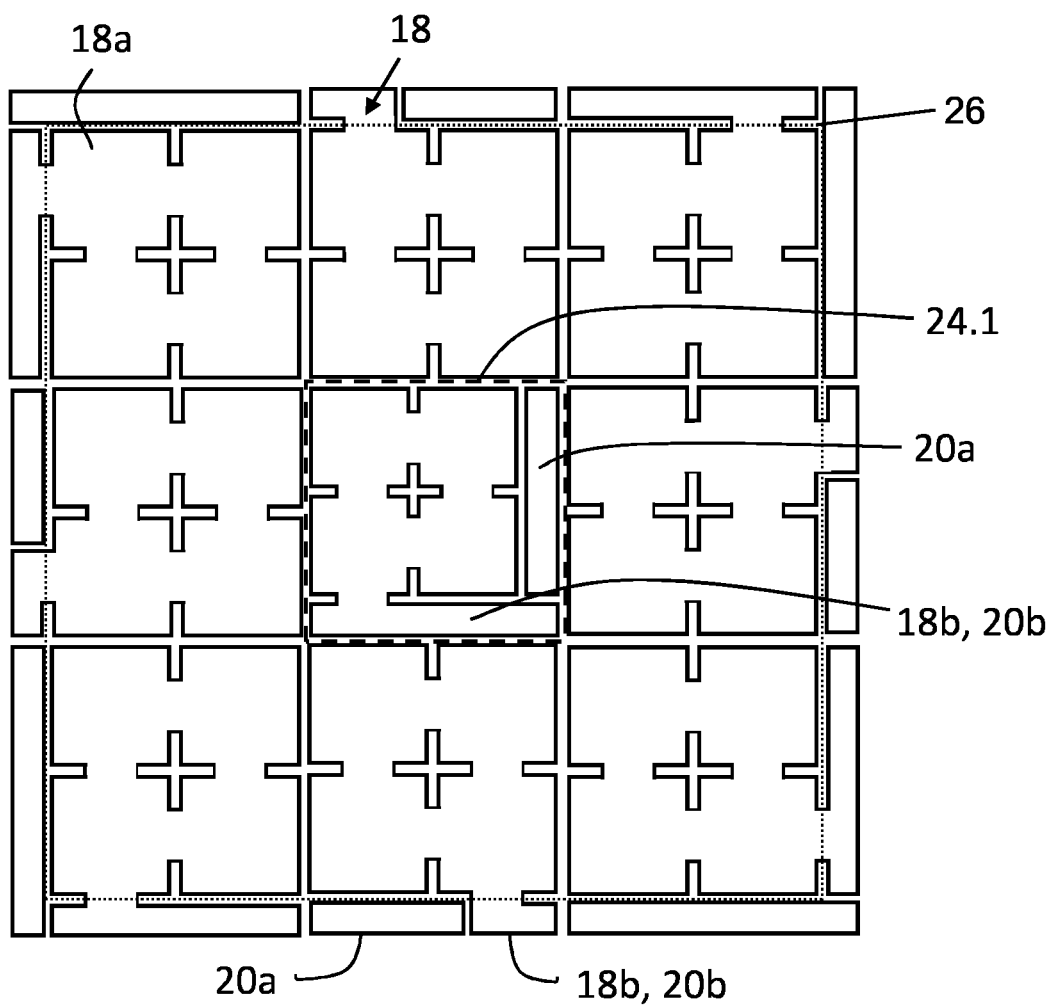
FIG. 26 shows a schematic representation of a plan view of coating regions and current connection regions for an LED arrangement having many LEDs, according to another example.

FIG. 26 shows a schematic representation of a plan view of coating regions and current connection regions for an LED arrangement having many LEDs (here 6×6), according to another example. In this 6×6 LED arrangement, in which more than two LED groups are arranged both in columns and rows, there is also an LED group 24.1 arranged in the center of the LED matrix. To also provide space for a connection region 18b/20b and optionally for a connection region 20a for this inner LED group 24.1, LEDs with smaller area dimensions are provided for the LED group 24.

The invention claimed is:

1. An LED arrangement comprising:
   a substrate;
   an electrically conductive first current connection region arranged on the substrate;
   a second electrically conductive current connection region arranged on the substrate; and
   a plurality of LEDs that form a plurality of LED groups;
   wherein each LED has a first LED contact region and a second LED contact region;
   the LED arrangement comprises a plurality of electrically conductive coating regions that are arranged in a manner spatially separated from one another on the substrate, with each contact region being subdivided into a contact region and a transition region adjacent to the contact region, and wherein the second current connection region constitutes one of the transition regions;
   each LED group is assigned to exactly one of the coating regions such that one of the LED groups is arranged on the contact region of the coating region assigned to said LED group with the result that the first LED contact regions of the respective LEDs contact the contact region of the coating region assigned to their LED group;
   each transition region of the coating regions is arranged such that it protrudes beyond the edge region;
   the first current connection region is electrically conductively connected to a second LED contact region of one of the LEDs arranged at the edge region; and
   apart from the second current connection region, each transition region is electrically conductively connected to a second LED contact region of one of the LEDs of an adjacent LED group arranged at the edge region, with the result that the plurality of LED groups are connected in series.

2. The LED arrangement as claimed in claim 1, wherein a respective LED group has at least one LED arranged at an edge region of the entirety of the LED groups.

3. The LED arrangement as claimed in claim 1, having at least one LED group that does not comprise an LED arranged at an edge region of the entirety of the LED groups.

4. The LED arrangement as claimed in claim 1, having at least one electrically conductive auxiliary connection region arranged on the substrate, wherein the second LED contact regions of the LEDs of at least one common LED group are connected to the at least one auxiliary connection region by connections.

5. The LED arrangement as claimed in claim 1, wherein a connection between a second LED contact region of an LED and the at least one auxiliary connection region or the first connection region is configured such that a further LED located between the LED and the auxiliary connection region or the first connection region is bridged by the connection.

6. The LED arrangement as claimed in claim 1, wherein a connection between a second LED contact region of a first LED and the at least one auxiliary connection region, or the first connection region, is configured such that the connection is deposited and contacted on a second contact region of a second LED, located between the first LED and the auxiliary connection region or first connection region.

7. The LED arrangement as claimed in claim 1, wherein, within the LED arrangement a contacting trench is provided in which the respective transition regions for the respective LED groups located along both sides of the contacting trench are alternately arranged.

8. The LED arrangement as claimed in claim 7, wherein a first LED group is connected to the first connection region and a last LED group to the second connection region.

9. The LED arrangement as claimed in claim 1, wherein separate first current connection regions are provided for two or more LED groups.

10. The LED arrangement as claimed in claim 9, wherein the separate current connection regions are designed to be connectable by electrically conducting bridges if required.

11. The LED arrangement as claimed in claim 1, wherein the length of the electrical connections is not more than 3 mm.

12. The LED arrangement as claimed in claim 1, wherein each of the LED groups has a plurality of the LEDs.

13. The LED arrangement as claimed in claim 1, wherein the second LED contact regions of all LEDs of a respective common LED group are connected to each other in an electrically conducting manner.

14. The LED arrangement as claimed in claim 1, wherein each LED group has exactly the same number of LEDs.

15. The LED arrangement as claimed in claim 1, wherein all LEDs of a respective common LED group are arranged in a row.

16. The LED arrangement as claimed in claim 1, wherein the LED groups are arranged relative to one another in a plurality of rows and/or a plurality of columns.

17. The LED arrangement as claimed in claim 1, wherein at least the transition regions that are different from the second current connection region are bent at an angle so that they each have a first partial region that extends away from the edge region, and a second partial region which directly adjoins the first partial region at an angle or a right angle, and extends toward the neighboring LED group that comprises the LED, to the second LED contact region of which the relevant edge region is electrically conductively connected.

18. The LED arrangement as claimed in claim 1, wherein at least the transition regions that are different from the second connection region are all bent in the same direction.

19. The LED arrangement as claimed in claim 1, wherein the first current connection region is electrically conductively connected to the second LED contact region of the LED, arranged at the edge region, of the LED group adjacent to the LED group which comprises the coating region having the second current connection region as a transition region.

20. The LED arrangement as claimed in claim 1, wherein the LEDs of a respective LED group located at the edge region that are electrically conductively connected to the transition region of the coating region assigned to the neighboring LED group, are arranged such that at least a part of the respective second LED contact surface is arranged at the edge region.

21. The LED arrangement as claimed in claim 1, wherein the second LED contact regions of the LEDs of at least one common LED group are interconnected by an electrically conducting flat element having a height that is less than its length and width.

22. The LED arrangement as claimed in claim 21, wherein the electrically conducting flat element extends in a straight line across all the second contact regions of the LEDs of the common LED group, and at the edge region is bent toward the substrate and runs toward the transition region of the coating region and is electrically conductively connected to the latter, which is assigned to one of the neighboring LED groups.

23. The LED arrangement as claimed in claim 1, wherein the second LED contact regions of the LEDs of at least one common LED group are electrically conductively connected to one another by at least one stranded wire that extends essentially in a straight line across all the second contact regions of the LEDs of the common LED group.

24. A lighting device having an LED arrangement as claimed in claim 1.

\* \* \* \* \*